(12) United States Patent
Nicollini et al.

(10) Patent No.: US 8,791,752 B2
(45) Date of Patent: Jul. 29, 2014

(54) TWO-STAGE CLASS AB OPERATIONAL AMPLIFIER

(75) Inventors: Germano Nicollini, Piacenza (IT); Carlo Pinna, Milan (IT)

(73) Assignee: ST-Ericsson SA, Plan-les-Quates (CH)

( * ) Notice: Subject to any disclaimer, the term of this patent is extended or adjusted under 35 U.S.C. 154(b) by 0 days.

(21) Appl. No.: 14/002,416

(22) PCT Filed: Feb. 27, 2012

(86) PCT No.: PCT/EP2012/053266
§ 371 (c)(1),
(2), (4) Date: Oct. 21, 2013

(87) PCT Pub. No.: WO2012/116954
PCT Pub. Date: Sep. 7, 2012

(65) Prior Publication Data
US 2014/0035665 A1    Feb. 6, 2014

Related U.S. Application Data

(60) Provisional application No. 61/452,769, filed on Mar. 15, 2011.

(30) Foreign Application Priority Data

Mar. 1, 2011    (EP) ..................................... 11156379

(51) Int. Cl.
*H03F 3/45*    (2006.01)
(52) U.S. Cl.
USPC .......................................... 327/562; 330/253
(58) Field of Classification Search
USPC ............................. 327/560–563; 330/253, 257
See application file for complete search history.

(56) References Cited

U.S. PATENT DOCUMENTS

| | | | |
|---|---|---|---|
| 6,392,485 B1 | 5/2002 | Doi et al. | |
| 7,652,531 B2 * | 1/2010 | Wang et al. | ...................... 330/99 |

(Continued)

OTHER PUBLICATIONS

Adams, R., et al. "A 113-dB SNR Oversampling DAC with Segmented Noise-Shaped Scrambling", IEEE Journal of Solid-State Circuits, Dec. 1, 1998, pp. 1871-1878, vol. 33, No. 12, IEEE.

*Primary Examiner* — Dinh T. Le
(74) *Attorney, Agent, or Firm* — Coats and Bennett, P.L.L.C.

(57) ABSTRACT

The invention relates to a two stage class AB operational amplifier for driving a load, comprising at least an input stage comprising differential input terminals and an output terminal to provide a driving signal. In addition, the operational amplifier comprises an output stage comprising a first and second input terminals operatively associated to the input stage to be driven on the basis of said driving signal and a driving circuit operatively interposed between said input stage and the output stage. The operational amplifier is characterized in that the driving circuit comprises a first portion comprising at least one resistor operatively connected between a first reference potential via a first circuitry block comprising a PMOS transistor and a second reference potential via a second circuitry block comprising a NMOS transistor. The voltage drop on said at least a first resistor is fixed to a value depending on said first and second reference potentials and the gate-source voltages of said PMOS and NMOS transistors, respectively. The driving circuit further comprises a second portion comprising a first resistor and a second resistor having first terminals connected one another in a common terminal which is connected to the output terminal of the input stage. Said first resistor has a second terminal connected the first input terminal of the output stage and said second resistor has a second terminal connected to the second input terminal of the output stage. Said second terminals of the first and second resistors (R2') are connected to the first reference potential via a third circuitry block and to the second reference potential (GND) via a fourth circuitry block, respectively. Said third (MW, M9) and fourth (M10, MX) circuitry blocks are arranged to be operatively connected to said first and second circuitry blocks, respectively, so that the voltage drop between the second terminals is substantially equal to the value of the voltage drop (VR1) across said at least one resistor.

14 Claims, 7 Drawing Sheets

(56) References Cited

U.S. PATENT DOCUMENTS

| | | | |
|---|---|---|---|
| 7,786,802 B2 * | 8/2010 | Liu | 330/255 |
| 7,800,447 B2 * | 9/2010 | Bandyopadhyay et al. | 330/267 |
| 2008/0036538 A1 | 2/2008 | Lee | |
| 2009/0146738 A1 | 6/2009 | Chang | |

* cited by examiner

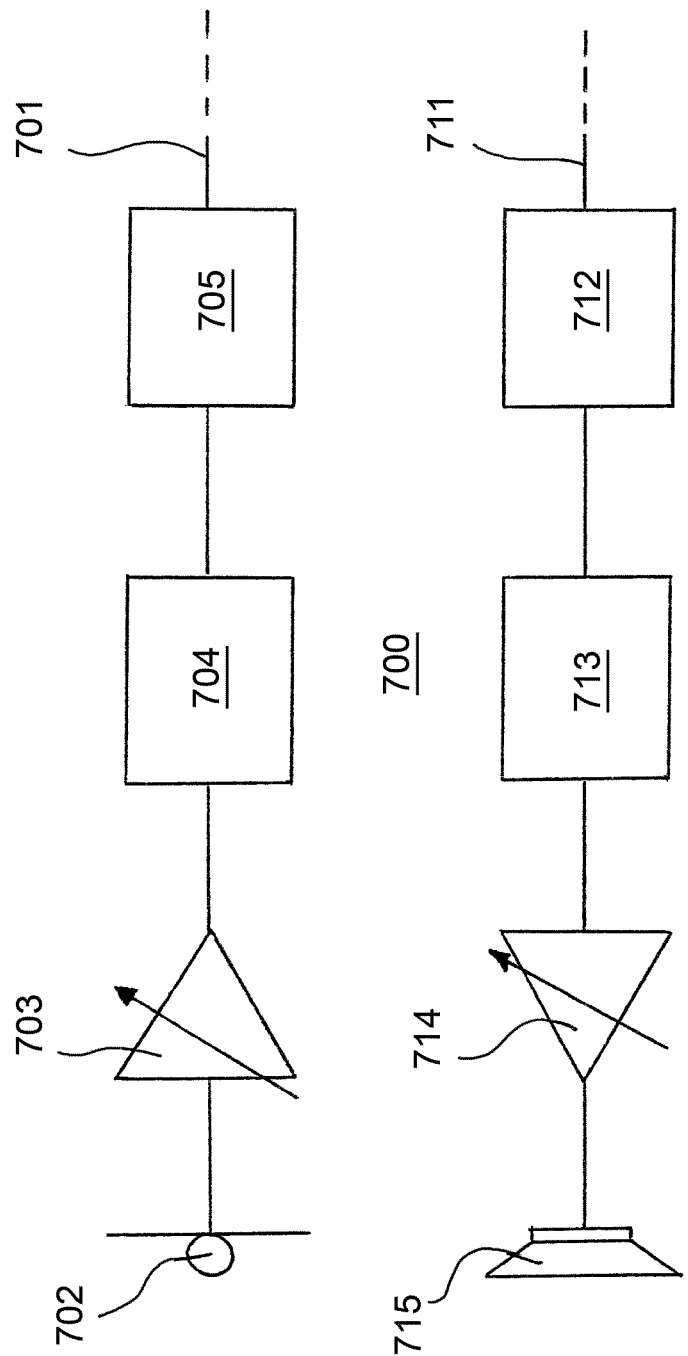

US 8,791,752 B2

TWO-STAGE CLASS AB OPERATIONAL AMPLIFIER

TECHNICAL FIELD

The present invention relates to operational amplifiers, particularly the invention relates to a two-stage operational amplifier in class AB.

BACKGROUND ART

Two-stage Operational Trans-conductance Amplifiers (OTAs) in class AB are probably the most used building blocks in CMOS analog and mixed-signal integrated circuits.

For example, Switched-Capacitor (SC) continuous time $\Sigma\Delta$ converters and high frequency filters, which are based on active integrators, are made of several two-stage class AB OTAs to perform the integrating function, as well as Analog-to-Digital Converters (ADCs) and Digital-To-Analog Converters (DACs) use operational trans-conductance amplifiers as buffering or multiplying stages. Moreover, two-stage class AB OTAs can be used in any other applications in which there is a need of signal amplification, e.g. portable devices, MP3 players, cellular phones, PDAs (Personal Digital Assistant), portable computers, acoustic transducers, and so on.

Two stage class AB OTAs are able to drive capacitive loads while acting as integrators in order to maintain a compromise between the operational trans-conductance amplifiers stability on one side and power consumption on the other, and they may also be used to drive resistive loads but then they have the disadvantage of requiring an output stage dc biasing current much higher than the one required for OTA stability when used with switched-capacitor circuits.

A known two-stage class AB OTA for driving e.g. a resistive load L is the circuit structure 100 shown in FIG. 1. In more detail, the OTA 100 includes a cascode input stage 101, comprising transistors M1-M8 and current generators Ib1 and Ib2, and an output stage 102, comprising MOS transistors MY and MZ, driven by the input stage 101. In particular, the transistor MY is directly driven by the output node N of the input stage 101, the transistor MZ is driven by a driving circuit 103 made by MOS transistors M9-M13, MX, MW and a current generator 2Ib, which in turn is driven by the output node N of the input stage 101. The output stage 102 is electrically connected to a resistive load L, in order to drive it.

Without any input signal at the input stage 101, there is no current to the resistive load L, thus the external feedback of the OTA (not shown) forces the dc currents of MY and MZ to be equal. If transistor MY=k MX and transistor MZ=k MW (wherein k is the gain factor, k>>1), the dc currents in the transistor MX and the transistor MW are scaled by a factor 1/k and forced to be equal. Since the dc current of transistor MW is obtained by a current mirror M10-M13, even the current in the transistor M10 is equal to the one in the transistor MX. As the sum of the currents in transistors MX and M10 is equal to 2Ib, the dc current of the output stage 102 is defined and equal to kIb.

In the presence of an input signal at the input stage 101, during a negative portion of a waveform of the output signal at the output stage 102 (node O), the voltage at the output node N of the input stage 101 increases according to the output signal amplitude, as well as the currents in transistors MX and MY, while the currents in transistors M10-M13, MW, and MZ decrease more and more until to reduce to zero. The current drained by the transistor MY from the resistive load L can be much higher than its dc current kIb because of the quadratic relationship between the MOS drain current Id and its gate-source voltage.

During the positive portion of the waveform of the output signal at the output stage 102 (node O), the currents in the transistors MX and MY are reduced, while the currents in the transistors M10-M13, MW, and MZ are increased following the increasing of the amplitude of the output signal at node O. However, during the positive portion of the waveform of the output signal at the output stage 102 (node O), the maximum value of the current that the transistor MZ can provide to the resistive load L is limited to 2kIb because in turn the maximum value of current in transistors M10-M13 and MW is given by the current generator 2Ib itself, even if the transistor MX is turned off.

Thus, such a two stage OTA in class AB has the drawback that the maximum value of current that can be provided to the resistive load L is limited to two times the dc current of its output stage 101.

A reference to the above circuit in FIG. 1 can be found in the scientific publication "A 113 dB SNR Oversampling DAC with segmented Noise-Shaped Scrambling" by R. Adams et al., IEEE JSSC, December 1998, page 63, FIG. 4.

SUMMARY OF THE INVENTION

An object of the present invention is to provide a two-stage operational amplifier in class AB which overcomes at least some of the drawbacks and limitations of the known prior art.

An operational amplifier in class AB for driving a load according to the invention comprises at least an input stage comprising differential input terminals and an output terminal to provide a driving signal, an output stage comprising first and second input terminals operatively connected to the input stage to be driven on the basis of said driving signal, and a driving circuit operatively interposed between said input stage and the output stage. Such driving circuit comprises a first portion comprising at least one resistor operatively connected between a first reference potential via a first circuitry block comprising a PMOS transistor and a second reference potential via a second circuitry block comprising a NMOS transistor. The voltage drop on said at least one resistor is fixed to a value depending on said first and second reference potentials and the gate-source voltages of said PMOS and NMOS transistors, respectively. Such driving circuit further comprises a second portion comprising a first resistor and a second resistor having first terminals connected with one another in a common terminal which is connected to the output terminal of the input stage. The first resistor has a second terminal connected to the first input terminal of the output stage and the second resistor has a second terminal connected to the second input terminal of the output stage. The second terminals of the first and second resistors are connected to the first reference potential via a third circuitry block and to the second reference potential via a fourth circuitry block, respectively. The third and fourth circuitry blocks are arranged to be operatively connected to said first and second circuitry blocks, respectively, so that the voltage drop between the second terminals is substantially equal to the value of the voltage drop across said at least one resistor.

A further embodiment of the invention is a Analog-to-Digital Converter comprising a two-stage class AB operational amplifier in accordance with the invention.

A further embodiment of the invention is a digital audio device comprising such Analog-to-Digital Converter and a digital filter.

BRIEF DESCRIPTION OF THE DRAWINGS

The characteristics and the advantages of the present two-stage class AB operational amplifier will be better understood from the following detailed description of various embodiments thereof, which are given by way of illustrative and non-limiting examples with reference to the annexed drawings, in which:

FIG. 7 shows a block diagram of an electronic apparatus employing the two stage class AB operational amplifier according to the invention.

DETAILED DESCRIPTION OF PREFERRED EMBODIMENTS

Circuit diagrams of preferred embodiments of a class AB operational amplifier of the invention for driving a load L can be described with reference to FIGS. 2-6.

Figure 1:
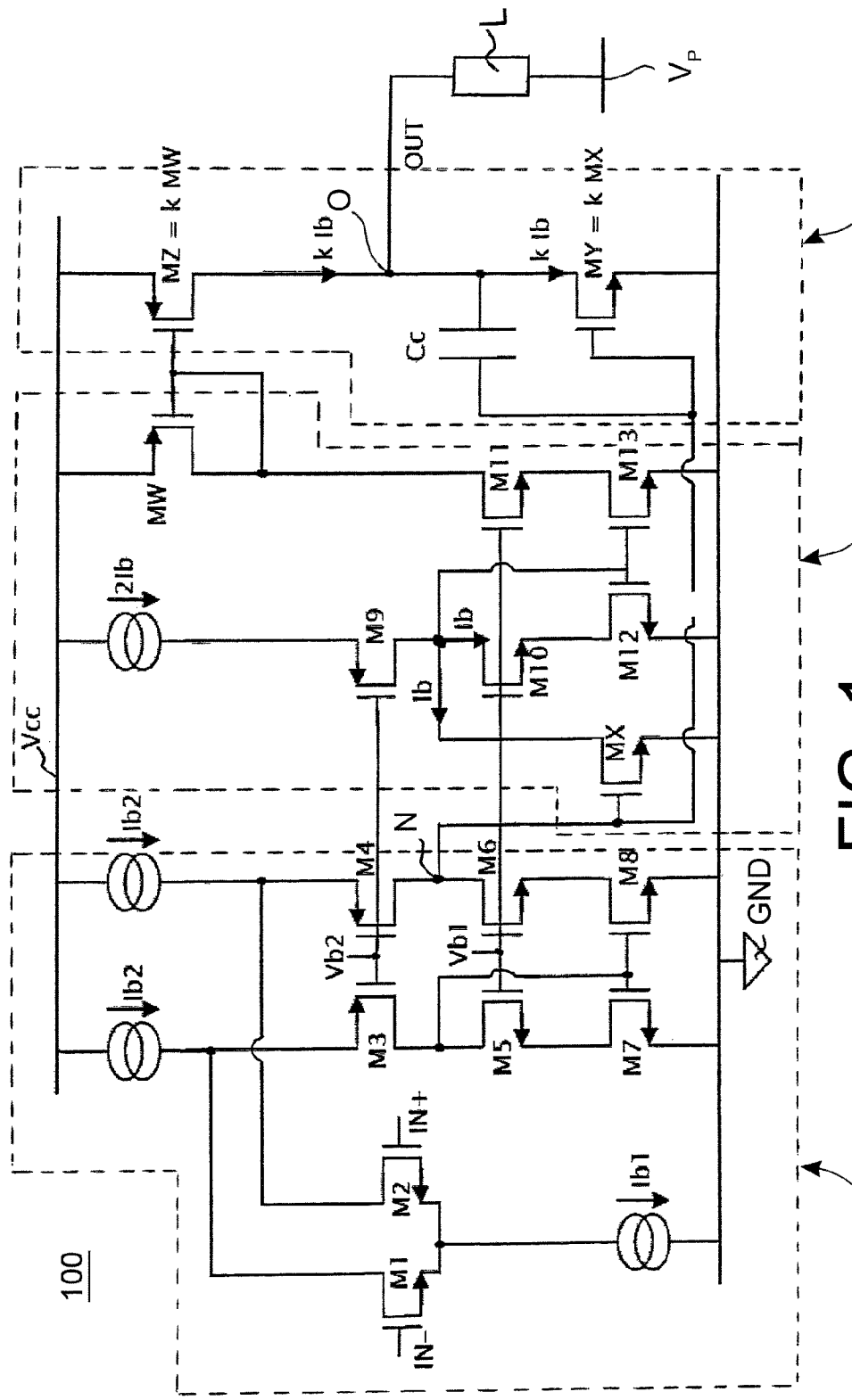
FIG. 1 shows a circuit diagram of a two stage class AB operational amplifier of the prior art.
Figure 2:
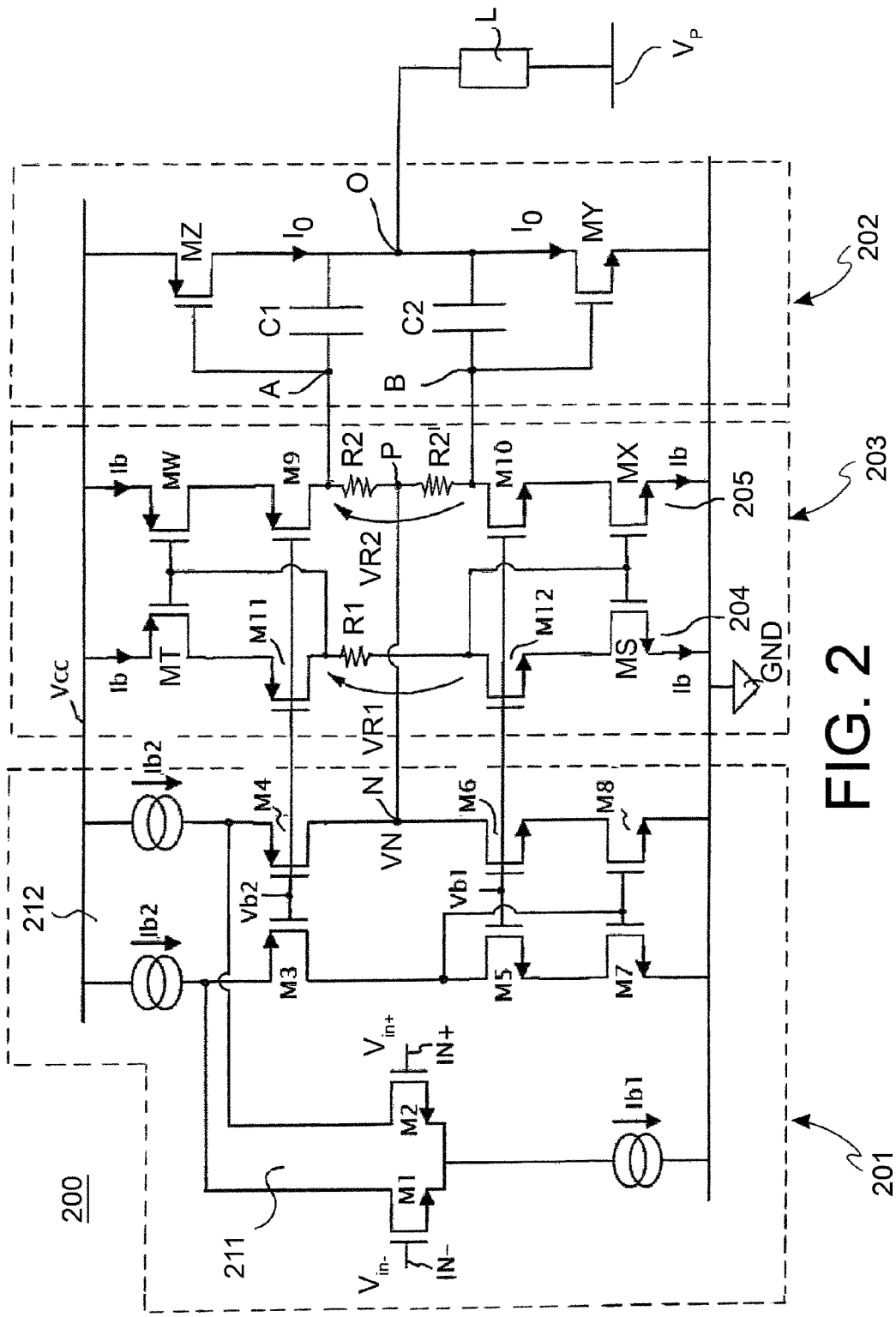
FIG. 2 shows a circuit diagram of a first embodiment of a two stage class AB operational amplifier of the invention.
Figure 3:
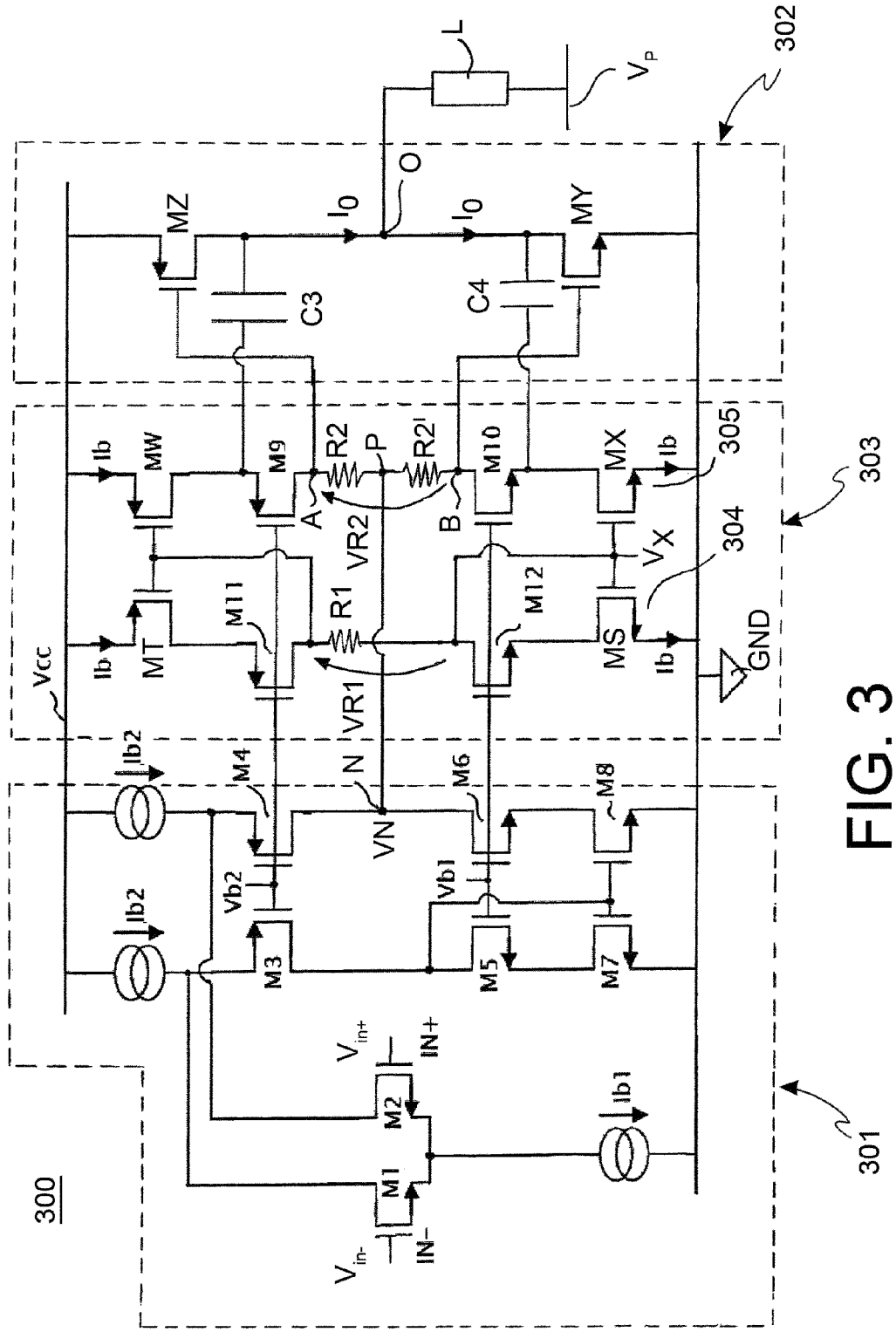
FIG. 3 shows a circuit diagram of a second embodiment of a two stage class AB operational amplifier of the invention.
Figure 4:
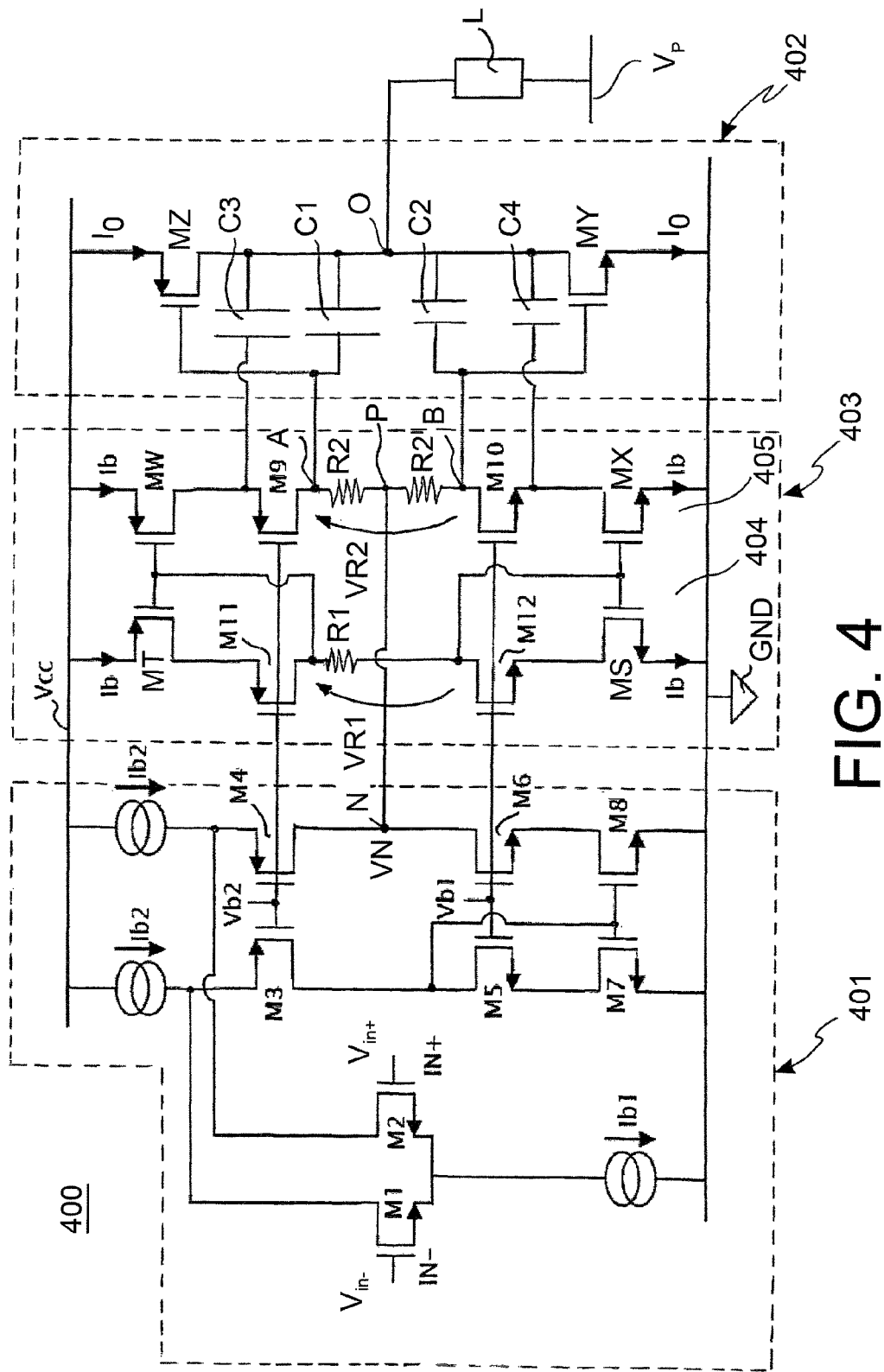
FIG. 4 shows a circuit diagram of a third embodiment of a two stage class AB operational amplifier of the invention.

In particular, the embodiments of FIGS. 2-4 relate to a class AB operational amplifier having differential input terminals and a single ended output terminal. The embodiments of FIGS. 5 and 6 relates to a class AB operational amplifier having differential input terminals and differential output terminals.

With reference to FIGS. 2-6, it should be noted that such an amplifier can be, for example, a two-stage class AB operational trans-conductance amplifier (OTA). In addition, the class AB operational amplifier can be integrated on a chip of semiconductor material.

Two stage class AB operational amplifiers can be used in any applications in which there is a need of signal amplification, e.g. portable devices, MP3 players, cellular phones, PDAs (Personal Digital Assistant), portable computers, acoustic transducers, and so on. An example of application of the operational amplifier according to the invention will be described later.

Furthermore, it should be observed that the load L to be driven can be of at least a resistive type or of resistive and capacitive type.

A circuit diagram of a first embodiment of a class AB operational amplifier 200 (or simply operational amplifier 200) of the invention for driving a load L can be described with reference to FIG. 2.

The operational amplifier 200 comprises at least an input stage 201 comprising differential input terminals IN+, IN− to receive differential input signals Vin+, Vin− and an output terminal N to provide a driving signal VN. Such input stage 201 is operatively connected between a first reference potential Vcc, for example the power supply, and a second reference potential GND, for example the ground. The value of the power supply depends on the application of the operational amplifier. Examples of possible values of the power supply are in the range 2.5 V-3.0 V.

In particular, the input stage 201 comprises a first differential input block 211 comprising a first NMOS transistor M1 and a second NMOS transistor M2. The gate terminals of such first M1 and second M2 NMOS transistor are the input terminals IN+, IN− of the input stage 201. The source terminals of both the first M1 and the second M2 NMOS transistor are connected together to the second potential reference GND via a first current generator Ib1.

The input stage 201 further comprises a cascode block 212 comprising a first PMOS transistor M3 and a second PMOS transistor M4 having the source terminal connected to the first potential reference Vcc via a second and third current generators Ib2. The source terminal of the first PMOS transistor M3 and the source terminal of the second PMOS transistor M4 of the cascode block 212 are connected to the drain terminal of the first NMOS transistor M1 and the drain terminal of the second NMOS transistor M2, respectively, of the differential input block 211. The gate terminals of the first PMOS transistor M3 and the second PMOS transistor M4 are connected together to receive a first control voltage Vb2. Typical values of such a first control voltage Vb2 are less than 1 V from the power supply (typically VCC−0.7 V or VCC−0.8 V).

Furthermore, the drain terminal of the first PMOS transistor M3 is connected to the second potential reference GND via a third M5 and a fourth M7 NMOS transistor connected in series with one another. In particular, the third NOMS transistor M5 has the drain terminal connected to the drain terminal of the first PMOS transistor M3 and the source terminal connected to the drain terminal of the fourth NMOS transistor M7. The source terminal of the fourth NMOS transistor M7 is connected to the second potential reference GND.

In addition, the drain terminal of the second PMOS transistor M4 is connected to the second potential reference GND via a fifth M6 and a sixth M8 NMOS transistor connected in series with one another. In particular, the fifth NMOS transistor M6 has the drain terminal connected to the drain terminal of the second PMOS transistor M4 and the source terminal connected to the drain terminal of the sixth NMOS transistor M8. The source terminal of the sixth NMOS transistor M8 is connected to the second potential reference GND.

The gate terminals of both the third M5 and the fifth M6 NMOS transistors are connected together to receive a second control signal Vb1 of the cascode block 212. Typical values of such a second control voltage Vb1 are less than 1 V from the ground (typically 0.7 V-0.8 V). The gate terminals of both the fourth M7 and the sixth M8 NMOS transistors are connected to the drain terminal of the third NMOS transistor M5.

The drain terminal of the second PMOS transistor M4 (as well as the drain terminal of the fifth NMOS transistor M6) is the output terminal N of the input stage 201 of the class AB operational amplifier 200.

The operational amplifier 200 further comprises an output stage 202 comprising a first A and a second B input terminals operatively associated to the input stage 201 to be driven on the basis of said driving signal VN.

In particular, the output stage 202 comprises an output PMOS transistor MZ and an output NMOS transistor MY connected in series with one another between the first reference potential Vcc and the second reference potential GND. The gate terminal of the output PMOS transistor MZ and the gate terminal of the output NMOS transistor MY are the first A and second B input terminals of the output stage 202. The first A and second B input terminal of the output stage 202 are operatively connected to the single ended output terminal N of the input stage 201, as it will be described later. The source terminal of the output PMOS transistor MZ is connected to the first reference potential Vcc. The source terminal of the output NMOS transistor MY is connected to the second reference potential GND. The drain terminal of the output PMOS transistor MZ and the drain terminal of the output NMOS transistor MY are connected together to form an output terminal O of the output stage 202.

In such first embodiment, the output stage 202 of the operational amplifier 200 advantageously further comprises a first compensation capacitor C1 connected between the gate terminal and the drain terminal of the output PMOS transistor MZ and a second compensation capacitor C2 connected between the gate terminal and the drain terminal of the output NMOS transistor MY. As well known to the skilled person, both the first C1 and C2 compensation capacitor are disposed in the output stage 202 so that the cut-off frequency of the operational amplifier can be stabilized. It should be observed that the values of the first C1 and second C2 compensation capacitors are typically on the order of pF.

In addition, it should be observed that the load L to be driven is symbolically illustrated in FIG. 2 connected between the output terminal O of the output stage 202 and a third reference potential Vp. Such third reference potential Vp can be the ground or another potential, e.g. half power supply (Vcc/2), depending on the application of the operational amplifier 200.

With reference again to FIG. 2, the operational amplifier 200 further comprises a driving circuit 203 operatively interposed between the input stage 201 and the output stage 202.

Particularly, the driving circuit 203 comprises a first portion 204 comprising at least one resistor R1 operatively connected between the first reference potential Vcc via a first circuitry block MT, M11 comprising a PMOS transistor MT and the second reference potential GND via a second circuitry block M12, MS comprising a NMOS transistor MS.

It should be noted that the voltage drop VR1 on said at least one resistor R1 is fixed to a value depending on said first Vcc and second GND reference potentials and the gate-source voltages of said PMOS MT and NMOS MS transistors, respectively, as indicated with the following relationship:

$$VR1 = Vcc - Vgs_{MT} - Vgs_{MS}$$

The current Ib passing through the first portion 204 of the driving circuit can be defined as follows:

$$Ib = (Vcc - Vgs_{MT} - Vgs_{MS})/R1$$

Moreover, the first circuitry block MT, M11 further comprises a further PMOS transistor M11 interposed between said PMOS transistor MT and said at least one resistor R1. The further PMOS transistor M11 has the gate terminal connected to the input stage 201 and said PMOS transistor MT has the gate terminal connected to the drain terminal of said further PMOS transistor M11. Furthermore, the further PMOS transistor M11 has the source terminal connected to the drain terminal of the PMOS transistor MT and the drain terminal connected to the at least one resistor R1.

The PMOS transistor MT has the source terminal connected to the first reference potential Vcc and the gate terminal connected to the at least one resistor R1. Particularly, the gate terminal of the further PMOS transistor M11 is connected to the gate terminals of said first M3 and second M4 PMOS transistor of the cascode block 212 of the input stage 201, in order to receive the first control signal Vb2 of the cascode block 212.

It should be noted that such at least one resistor R1 could be split in a first and second resistors, preferably connected in series with one another between said first circuitry block MT, M11 and said second circuitry block M12, MS, in order to match two other resistors of a second portion 205 of the driving circuit 203, as will be also described later. In this case, the voltage drop VR1 is the voltage drop on the connection in series of said first and second resistors.

Returning to the first embodiment of FIG. 2, the driving circuit 203 further comprises a second portion 205 comprising a first resistor R2 and a second resistor R2' having first terminals connected with one another in a common terminal P which is connected to the output terminal N of the input stage 201. In addition, the first resistor R2 has a second terminal connected to the first input terminal A of the output stage 202. The second resistor R2' has a second terminal connected to the second input terminal B of the output stage 202.

Furthermore, the second terminals A, B of the first R2 and second resistors R2' are connected to the first reference potential Vcc via a third circuitry block MW, M9 and to the second reference potential GND via a fourth circuitry block M10, MX.

Advantageously, the third MW, M9 and fourth M10, MX circuitry blocks are arranged to be operatively connected to said first MT, M11 and second M12, MS circuitry blocks so that the voltage drop VR2 between the second terminals A, B is substantially equal to the value of the voltage drop VR1 across said at least one resistor R1.

Particularly, the sum of the value of said first R2 and second resistor R2' are advantageously equal to the value of said at least one resistor R1. In the case of splitting such at least one resistor R1 in a first and second resistor (as previously indicated), the first resistor R2 of the second portion 205 is equal to the first resistor of the first portion 204 and the second resistor R2' of the second portion 205 is equal to the second resistor of the first portion 204. Examples of values of the at least one resistor R1 (or the sum of such first and second resistors of the first portion 204) and the sum of such first R2 and second R2' resistors of the second portion 205 are tens of KΩ.

With reference again to the first portion 204 of the driving circuit 203 of FIG. 2, the second circuitry block M12, MS further comprises a further NMOS transistor M12 interposed between said at least one resistor R1 and said NMOS transistor MS. Particularly, in the first embodiment of FIG. 2, the further NMOS transistor M12 is interposed between the at least one resistor R1 and the NMOS transistor MS. The further NMOS transistor M12 has the gate terminal connected to the input stage 201 and said NMOS transistor MS has the gate terminal connected to the drain terminal of said further NMOS transistor M12.

In addition, the gate terminal of the further NMOS transistor M12 is connected to the gate terminals of said third M5 and fifth M6 NMOS transistor of the cascode block 212 of the input stage 201, in order to receive the second control voltage Vb1 of the cascode block 212. The further NMOS transistor M12 has the drain terminal connected to the further resistor R1 of the first portion 204 and the source terminal connected to the drain terminal of the NMOS transistor MS. The source terminal of such NMOS transistor MS is connected to the second reference potential GND.

With reference to the second portion 205 of the driving circuit 203, the third circuitry block M9, MW comprises a PMOS transistor MW and a further PMOS transistor M9 connected in series with one another between said first reference potential Vcc and the first input terminal A of the output stage 202.

Particularly, the PMOS transistor MW has the gate terminal connected to the drain terminal of the further PMOS transistor M11 (and also to the at least one resistor R1) of said first portion 204 of the driving circuit 203. It should be observed that the gate terminal of the PMOS transistor MW is also connected to the gate terminal of the PMOS transistor MT of said first portion 204 of the driving circuit 203. Furthermore, the PMOS transistor MW has the source terminal connected to the first reference potential Vcc and the drain terminal connected to the source terminal of the further PMOS transistor M9. The further PMOS transistor M9 has the drain terminal connected to the first input terminal A of the output stage 202. In addition, the further PMOS transistor M9 has the gate terminal connected to the input stage 201. In detail, the gate terminal of the further PMOS transistor M9 is connected to the gate terminals of both the first M3 and the second M4 PMOS transistor of the cascode block 212 of the input stage 201, in order to receive the first control signal Vb2.

With reference again to the second portion 205 of the driving circuit 203, the fourth circuitry block M10, MX comprises a NMOS transistor M10 and a further NMOS transistor MX connected in series one another between the second input terminal B of the output stage 202 and the second reference potential GND.

Particularly, the NMOS transistor M10 has the gate terminal connected to the input stage 201. In detail, the gate terminal of the NMOS transistor M10 is connected to gate terminals of both the third M5 and fifth M6 NMOS transistors of the cascode block 212 of the input stage 201, in order to receive the second control signal Vb1. The NMOS transistor M10 has the drain terminal connected to the second input terminal B of the output stage 202 and the source terminal connected to the drain terminal of the further NMOS transistor MX. The fourth NMOS transistor MX has the gate terminal connected to the drain terminal of said further NMOS transistor M12 (and to the at least one resistor R1) of said first portion 204 of the driving circuit 203. Furthermore, said further NMOS transistor MX of the second portion 205 has also the gate terminal connected to the gate terminal of the further NMOS transistor MS of the first portion 204 of the driving circuit 203. The further NMOS transistor MX has the source terminal connected to the second reference potential GND.

Advantageously, the PMOS MW and further PMOS M9 transistors of the third circuitry block MW, M9 are equal to said PMOS MT and further PMOS M11 transistors of the first circuitry block MT, M11, respectively. In fact, the operational amplifier 200 should preferably be manufactured so that: the width (W) and the length (L) of the PMOS transistor MW are equal to the width (W) and the length (L), respectively, of the PMOS transistor MT; the width (W) and the length (L) of the further PMOS transistor M9 are equal to the width (W) and the length (L), respectively, of the further PMOS transistor M11.

In addition, the third M10 and fourth MX NMOS transistor of the fourth circuitry block M10, MX are advantageously equal to said further NMOS M12 and said NMOS MS transistors of the second circuitry block M12, MS, respectively. In fact, the operational amplifier 200 should preferably be manufactured so that: the width (W) and the length (L) of the NMOS transistor M10 are respectively equal to the width (W) and the length (L) of the further NMOS transistor M12; and the width (W) and the length (L) of the fourth NMOS transistor MX are respectively equal to the width (W) and the length (L) of the NMOS transistor MS.

Since the circuitry elements MT, M11, R1, M12 and MS, respectively, of the first portion 204 of the driving circuit 203 are preferably equal to the circuitry elements MW, M9, R2+R2', M10 and MX, respectively, of the second portion 205 of the driving circuit 203 (as described in detail in the previous paragraphs), the first portion 204 of the driving circuit 203 can be defined as a replica of the second portion 205 of the driving circuit 203. In view of this, the current passing through the second portion 205 of the driving circuit is the same current Ib passing through the first portion 204 of the driving circuit 203. Therefore, the voltage drop VR2 across the first R2 and the second R2' resistors (i.e. fixed on the second terminals A, B) is substantially equal to the value of the voltage drop VR1 across said at least one resistor R1, and it can be indicated by the same relationship:

$$VR2 = Vcc - Vgs_{MT} - Vgs_{MS}$$

Advantageously, the bias voltage of the first input terminal A (gate terminal of the output PMOS transistor MZ) and the bias voltage of the second input terminal B (gate terminal of the output NMOS transistor MY) are defined by a replica circuit and therefore the output current Io passing through the output PMOS transistor MZ and the output NMOS transistor MY is defined by the driving circuit 203.

Particularly, it should be noted that output stage 202 should preferably be manufactured so that: the width (W) and the length (L) of the output PMOS transistor MZ are k times the width (W) and the length (L), respectively, of the first PMOS transistor MW of the third circuitry block M9, MW; the width (W) and the length (L) of the output NMOS transistor MY are k times the width (W) and the length (L), respectively, of the fourth NMOS transistor MX of the fourth circuitry block M10, MX.

In such a way, the output current Io is k times the current Ib passing through the first 204 and the second 205 portion of the driving circuit 203, and it can be defined by the following relationship: Io=k Ib. The current Ib can be defined by the following relationship:

$$Ib = (Vcc - Vgs_{MT} - Vgs_{MS})/(R2 + R2')$$

In addition, it should be noted that the gate terminals of both the output PMOS transistor MZ and the output NMOS transistor MY are high impedance nodes and therefore there are not the limitations on the sourcing/sinking output current above mentioned with reference the cited prior art.

It should be noted that the current Ib generated in the driving circuit 203 is completely independent from the current generated by both the first Ib1, the second and third Ib2 current generators of the input stage 201. Such conditions is valid also for all the other embodiments of the invention described here below with reference to FIGS. 3-6.

Furthermore, it should be observed that the architecture of the first embodiment can be advantageously used to drive loads of the resistive and/or small/medium capacitive type. Typical values of such resistive load and such capacitive load are, for example, 1 KΩ and 10 pF, respectively.

A circuit diagram of a second embodiment of a class AB operational amplifier 300 (or simply operational amplifier 300) of the invention for driving a load L can be described with reference to FIG. 3.

The operational amplifier 300 comprises an input stage 301 and a driving circuit 303 identical to the input stage 201 and the driving circuit 203, respectively, already described with reference to the first embodiment of the invention (FIG. 2).

The operational amplifier 300 further comprises an output stage 302 having the same structure of the output stage 202 of the first embodiment, with a different arrangement of the compensation capacitors for stabilizing the cut-off frequency of the operational amplifier.

In fact, in such second embodiment, the output stage 302 of the operational amplifier 300 advantageously further comprises a first compensation capacitor C3 connected between the source terminal of the PMOS transistor M9 of the third circuitry block MW, M9 and the drain terminal of the output PMOS transistor MZ and a second compensation capacitor C4 connected between the source terminal of the NMOS transistor M10 of the fourth circuitry block M10, MX and the drain terminal of the output NMOS transistor MY.

It should be observed that also the value of the first C3 and second C4 compensation capacitors is typically on the order of pF.

Furthermore, it should be noted that the architecture of the second embodiment can be advantageously used to drive loads of the resistive and/or large capacitive type. Typical values of such resistive load and such capacitive load are, for example, 1 KΩ and 20-100 pF.

A circuit diagram of a third embodiment of a class AB operational amplifier 400 (or simply operational amplifier 400) of the invention for driving a load L can be described with reference to FIG. 4.

The operational amplifier 400 comprises an input stage 401 and a driving circuit 403 identical to the input stage 201 and the driving circuit 203, respectively, already described with reference to the first embodiment of the invention (FIG. 2).

The operational amplifier 400 further comprises an output stage 402 having the same structure of the output stage 202 the first embodiment, with a different arrangement of the compensation capacitors for stabilizing the cut-off frequency of the operational amplifier.

In fact, in such third embodiment, the output stage 402 of the operational amplifier 300 advantageously comprises a first compensation capacitor C1 connected between the gate terminal and the drain terminal of the output PMOS transistor MZ and a second compensation capacitor C2 connected between the gate terminal and the drain terminal of the output NMOS transistor MY of the output stage 402. In addition, the output stage 402 further comprises a third compensation capacitor C3 connected between the source terminal of the PMOS transistor M9 of the third circuitry block MW, M9 and the drain terminal of the output PMOS transistor MZ and a fourth compensation capacitor C4 connected between the source terminal of the NMOS transistor M10 of the fourth circuitry block M10, MX and the drain terminal of the output NMOS transistor MY.

Furthermore, it should be noted that the architecture of the third embodiment can be advantageously used to drive loads of the resistive and/or large capacitive type. Typical values of such resistive load and such capacitive load are, for example, 1 KΩ and 20-30 pF.

As already explained above, the operational amplifier of such first, second and third embodiment relates to class AB operational amplifiers having differential input terminals and a single ended output terminal.

A circuit diagram of a fourth embodiment of a class AB operational amplifier 500 (or simply operational amplifier 500) of the invention for driving a load L can be described with reference to FIG. 5.

In particular, the fourth embodiment of FIG. 5 relates to a class AB operational amplifier having differential input terminals (IN+, IN−) and differential output terminals (O, O'), as will be described below.

The operational amplifier 500 comprises an input stage 501 identical to the input stage described with reference to the previous embodiments. Such input stage 501 further comprises a further output terminal N' defined in the common node between the drain terminal of the first PMOS transistor M3 of the input stage 501 and the drain terminal of the third NMOS transistor M5. The output terminal N and the further output terminal N' of the input stage 501 represents the differential output terminal of the input stage 201.

The operational amplifier 500 further comprises an output stage 502 and a driving circuit 503 interposed between the output terminal N of the input stage 501 and the output stage 502. In particular, such output stage 502 and driving stage 503 are identical to the output stage and the driving circuit, respectively, previously described with reference to the third embodiment of FIG. 4. Moreover, it should be noted that the output stage 502 can be identical to the output stage previously described with reference to the second embodiment of FIG. 3 or to the first embodiment of FIG. 2.

In addition, the operational amplifier 500 further comprises a further output stage 502' identical to the output stage 502. The further output stage 502' has a further output terminal O' connected to the load L. In the figure, the first input terminal and the second input terminal of the further output stage 502' have been indicated with the reference A' and B', respectively. Furthermore, the common node between the first R2 and the second R2' resistor of the further output stage 502', connected to the further output terminal N' of the input stage 501, has been indicated with the reference P'.

In addition, it should be noted that the driving circuit 503 further comprises a third portion 505', analogous to the second portion previously described with reference to the other embodiments, which is interposed between said further output terminal N' of the input stage 501 and the further output stage 502'.

It should be observed that the driving circuit 503 is arranged to control the output stage 502 with the first 504 and the second 505 portion interposed between the output terminal N and the output stage 502. Furthermore, the driving circuit 503 is arranged to control the further output stage 502' with the first 504 and the third 505' portion interposed between the further output terminal N' and the further output stage 502'.

Figure 5:
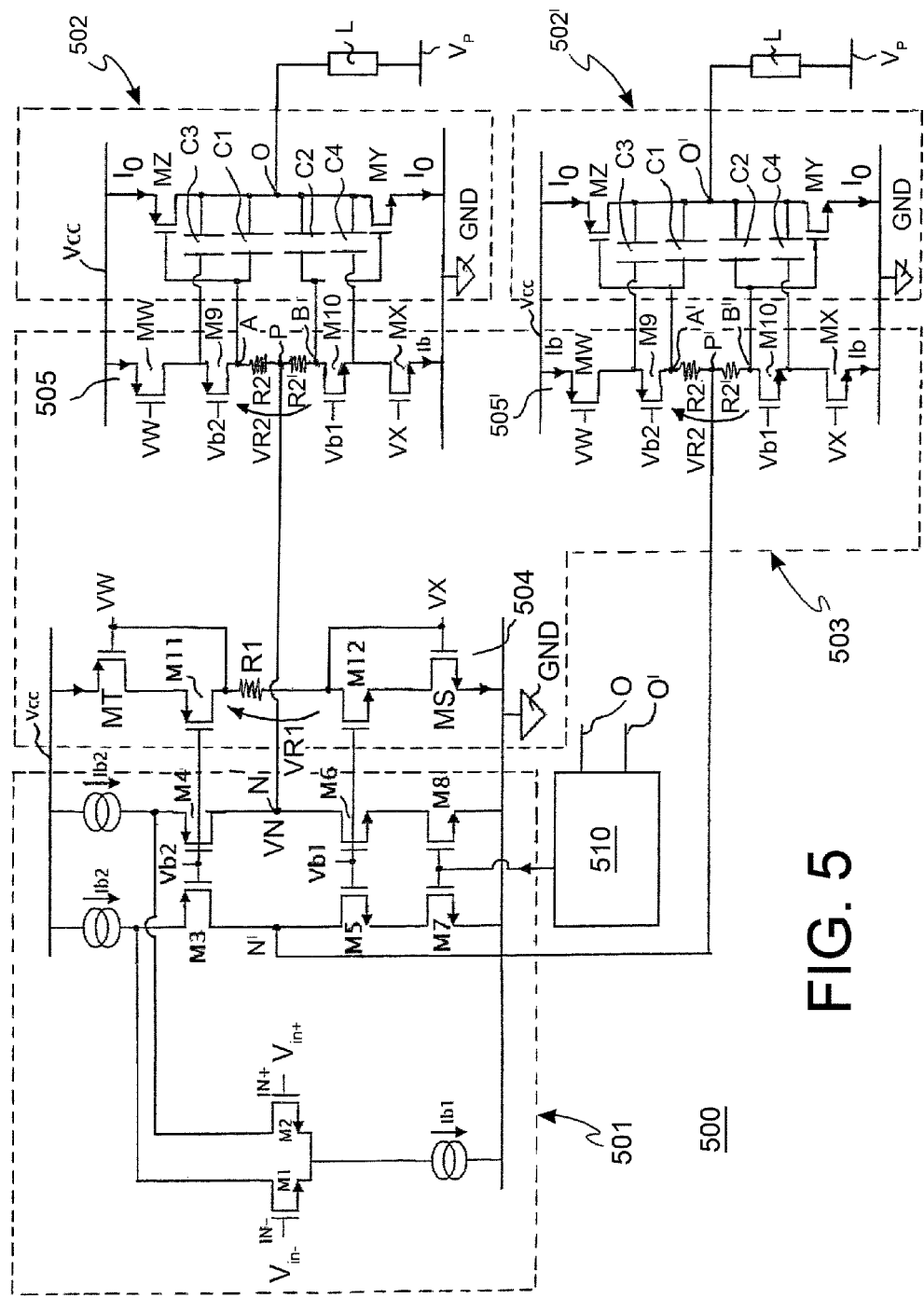
FIG. 5 shows a circuit diagram of a fourth embodiment of a two stage class AB operational amplifier of the invention.

In addition, as illustrated in FIG. 5, the operational amplifier 500 further comprises a common-mode feedback module 510 operatively interposed between the output terminals of the operational amplifier 500 (output terminal O and the further output terminal O'). Particularly, the common-mode feedback module 510 is arranged to control the gate terminals of both the fourth MOS transistor M7 and the sixth MOS transistor M8 of the input stage 501.

As already stated above, the operational amplifier 500 of FIG. 5 is a fully differential architecture which can be advantageously used in the case rejection of the power supply (first reference potential Vcc) or rejection of the common-node noise are needed as known to by a skilled person in the art.

Furthermore, it should be noted that the architecture of the fourth embodiment can be advantageously used to drive loads of the resistive and/or large capacitive type. Typical values of such resistive load and such capacitive load are, for example, 1 KΩ and 20-30 pF.

A circuit diagram of a fifth embodiment of a class AB operational amplifier 600 (or simply operational amplifier 600) of the invention for driving a load L can be described with reference to FIG. 6.

Figure 6:
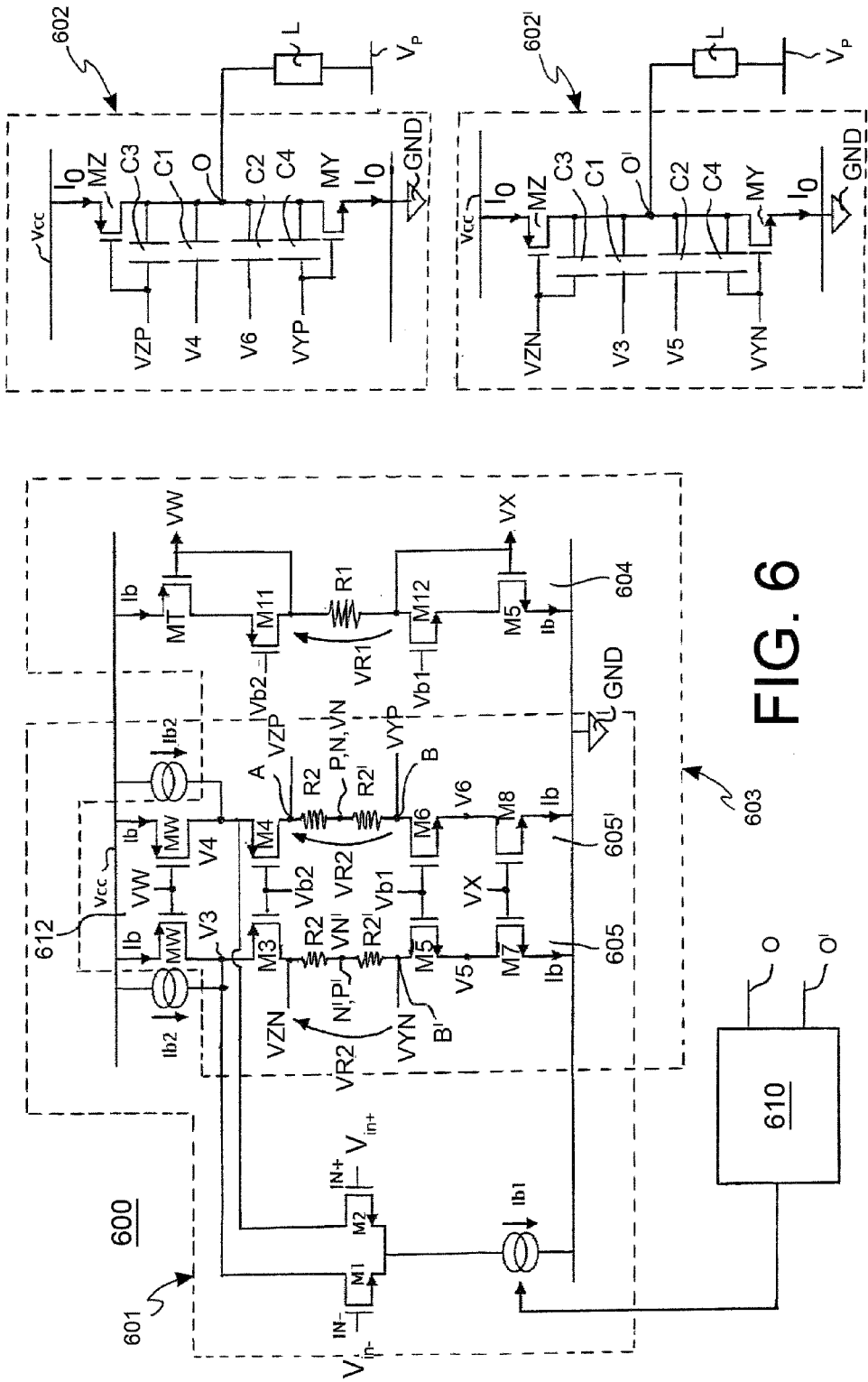
FIG. 6 shows a circuit diagram of a fifth embodiment of a two stage class AB operational amplifier of the invention.

As well as the operational amplifier 500 of the fourth embodiment, the operational amplifier 600 of FIG. 6 relates to a class AB operational amplifier having differential input terminals (IN+, IN−) and differential output terminals (O, O').

The operational amplifier 600 comprises a driving stage 603, an output stage 602 and a further output stage 602' identical to the driving stage 503, the output stage 502 and the further output stage 502' of the fourth embodiment of FIG. 5. Moreover, it should be noted that the output stage 602 and the further output stage 602' can be identical to the output stage previously described with reference to the second embodiment of FIG. 3 or to the first embodiment of FIG. 2.

With reference to the driving circuit 603, it should observed that, in the operational amplifier 600 of FIG. 6, the driving circuit 603 comprises a first portion 604.

With reference to the input stage 601, it should be noted that, in the operational amplifier 600 of the FIG. 6, the input stage 601 advantageously comprises the second portion 605 and the third portion 605' of the driving circuit 603.

In particular, the second 605 and the third portion 605' of the driving circuit 603 are embedded in the cascode block 612 of the input stage 601.

In particular, the second portion 605 is arranged so that: the PMOS transistor MW is connected in parallel to the third current generator Ib2, the second MOS transistor M4 corresponds to the further PMOS transistor M9, the fifth MOS transistor M6 corresponds to the NMOS transistor M10 and the sixth MOS transistor M8 corresponds to the further NMOS transistor MX, respectively, of the cascode block 612. The first R2 and the second resistor R2' are connected in series with one another between the drain terminal of the second MOS transistor M4 (corresponding to the first input terminal A of the output stage 602) and the drain terminal of the fifth MOS transistor M6 (corresponding to the second terminal B of the output stage 602). The common node P between the first R2 and the second R2' resistor is the output terminal N of the input stage 601.

In addition, the third portion 605' is arranged so that: the PMOS transistor MW is connected in parallel to the second current generator Ib2, the first MOS transistor M3 corresponds to the further PMOS transistor M9, the third MOS transistor M5 corresponds to the NMOS transistor M10 and the fourth MOS transistor M7 corresponds to the further NMOS transistor MX, respectively, of the cascode block 612. The first R2 and the second resistor R2' are connected in series one another between the drain terminal of the first MOS transistor M3 (corresponding to the first input terminal A' of the further output stage 602') and the drain terminal of the third MOS transistor M5 (corresponding to the second terminal B' of the further output stage 602'). The common node P' between the first R2 and the second R2' resistor is the further output terminal N' of the input stage 601.

Furthermore, it should be noted that the architecture of the fifth embodiment can be advantageously used to drive loads of the resistive and/or capacitive type. Typical values of such resistive load and such capacitive load are, for example, 1 KΩ and 20-30 pF.

Moreover, it should be noted that the differential architecture of the fifth embodiment (FIG. 6) has the advantage of saving both current and area, with respect to the fourth embodiment of FIG. 5.

Moreover, as illustrated in FIG. 6, the operational amplifier 600 further comprises a common-mode feedback module 610 operatively interposed between the output terminals of the operational amplifier 600 (output terminal O and the further output terminal O'). Particularly, the common-mode feedback module 610 is arranged to control the first current generator Ib1 of the input stage 601.

Taking the above considerations into account, the behavior of the operational amplifier of the present invention is described below, with particular reference to the first embodiment of FIG. 2. It should be noted that the operational amplifier is arranged to drive a load L of at least a resistive type or of resistive and capacitive type.

Without any input signal at the input stage 201, there is no current to the load L, thus the external feedback of the operational amplifier (not shown in the figures) forces the output currents Io passing through the output PMOS transistor MZ and the output NMOS transistor MY to be equal. Since the output PMOS transistor MZ=k MW and the output NMOS transistor MY=k MX, considering the drop voltage VR2 between the first input terminal A and the second input terminal B of the output stage 202 previously indicated (VR2=Vcc–$Vgs_{MT}$–$Vgs_{MS}$), it results that the dc voltages of the gate terminal of the output PMOS transistor MZ and the output NMOS transistor MY are Vcc–$Vgs_{MT}$ and $Vgs_{MS}$–GND, respectively, while the dc output current Io=k Ib.

In the presence of an input signal at the input stage 201, the control signal VN at the output terminal N of the input stage 201 directly drives the output stage 202, i.e. the gate terminals of the output PMOS transistor MZ and the output NMOS transistor MY, via the voltage drop VR2 between the first A and second B input terminals of the output stage 202 substantially equal to value of voltage drop fixed on the at least one resistor R1 and the further resistor R1. In such a way, no current mirror is needed and there is no limitation of the output current Io of the operational amplifier 200. Furthermore, it can be possible to fix the dc currents passing through the output PMOS transistor MZ and the output NMOS transistor MY without having the gate terminals of such output MOS transistors as low impedance nodes. Therefore, since the gate terminals of the output MOS transistors of the output stage 202 are high impedance nodes, limitation of the output current is advantageously avoided.

With reference now to FIG. 7, an example of an electronic apparatus employing the operational amplifier according to the invention is briefly described.

The electronic apparatus 700 is for example a mobile telephone. Such electronic apparatus 700 comprises a digital audio recorder device or chain 701 and a digital audio player device or chain 711. The other electronic components of the mobile telephone 700 operatively connected to both the audio chains, are not illustrated in the FIG. 7.

The digital audio recorder device 701 comprises a microphone 702.

Such digital audio recorder device 701 further comprises a microphone pre-amplifier 703.

In addition, the digital audio recorder device or simply digital audio device 701 further comprises an Analog-to-Digital Converter 704, e.g. of the continuous-time sigma-delta type.

Moreover, the digital audio recorder device 701 further comprises a digital filter 705.

It should be observed that the Analog-to-Digital Converter 704 comprises an operational trans-conductance amplifier in class AB of the type described above with reference to any of the embodiments of the invention (FIGS. 2-6).

The digital audio player device 711 comprises:
a further digital filter 712;
a Digital-to-Analog Converter 713, e.g. of the continuous-time switched circuit type;
a transducer amplifier 714 and a speaker 715.

An advantage provided by the class AB operational amplifiers 200, 300, 400, 500 and 600 of the invention is that the dc biasing output current is defined by the driving circuit interposed between the input stage and output stage of the operational amplifier, which is arranged to define the dc biasing voltages at the gate terminals of the output PMOS MZ and output NMOS MY transistors of the output stage by a first portion of the driving circuit which is identical to the second portion (and to the third portion) of the same driving circuit. In addition, the gate terminals of the output NMOS transistor MY and the output PMOS transistor MZ can be maintained at high impedance, thus no limitations on the sourcing/sinking output current above mentioned with reference the cited prior art are present.

The invention claimed is:

1. A two-stage class AB operational amplifier operative to drive a load, comprising:
    an input stage comprising differential input terminals and an output terminal operative to provide a driving signal;
    an output stage comprising first and second input terminals operatively connected to the input stage and operative to be driven on the basis of said driving signal;
    a driving circuit operatively interposed between the input stage and the output stage,
    wherein the driving circuit comprises
        a first portion comprising at least one resistor operatively connected between a first reference potential via a first circuitry block comprising a PMOS transistor and a second reference potential via a second circuitry block comprising a NMOS transistor, the voltage drop on said at least one resistor being fixed to a value depending on said first and second reference potentials and the gate-source voltages of said PMOS and NMOS transistors, respectively,
        a second portion comprising a first resistor and a second resistor having first terminals connected with one another in a common terminal which is connected to the output terminal of the input stage, said first resistor having a second terminal connected to the first input terminal of the output stage, said second resistor having a second terminal connected to the second input terminal of the output stage,
        said second terminals of the first and second resistors being connected to the first reference potential via a third circuitry block and to the second reference potential via a fourth circuitry block, respectively, said third and fourth circuitry blocks being arranged to be operatively connected to said first and second circuitry blocks, respectively, so that the voltage drop between the second terminals is substantially equal to the value of the voltage drop across said at least one resistor.

2. The operational amplifier according to claim 1, wherein the sum of the value of said first and second resistor is equal to the value of said at least one resistor.

3. The operational amplifier of claim 1, wherein said first circuitry block further comprising a further PMOS transistor interposed between said PMOS transistor and said at least one resistor, said further PMOS transistor having the gate terminal connected to the input stage and said PMOS transistor having the gate terminal connected to the drain terminal of said further PMOS transistor.

4. The operational amplifier of claim 3, wherein said second circuitry block further comprising a further NMOS transistor interposed between said at least one resistor and said NMOS transistor, said further NMOS transistor having the gate terminal connected to the input stage and said NMOS transistor having the gate terminal connected to the drain terminal of said further NMOS transistor.

5. The operational amplifier of claim 4, wherein said third circuitry block comprising a PMOS transistor and a further PMOS transistor connected in series with one another between said first reference potential and the first input terminal of the output stage, said PMOS transistor having the gate terminal connected to the drain terminal of the further PMOS transistor of said first portion of the driving circuit, said further PMOS transistor having the gate terminal connected to the input stage.

6. The operational amplifier of claim 5, wherein said fourth circuitry block comprising a NMOS transistor and a further NMOS transistor connected in series one another between the second input terminal of the output stage and the second reference potential, said NMOS transistor having the gate terminal connected to the input stage, said further NMOS transistor having the gate terminal connected to the drain terminal of said further NMOS transistor of said first portion of the driving circuit.

7. The operational amplifier of claim 1, wherein said PMOS and further PMOS transistor of the third circuitry block are equal to said PMOS and further PMOS transistor of the first circuitry block, respectively, and said NOMS and further NMOS transistor of the fourth circuitry block are equal to said further NMOS and said NMOS transistor of the second circuitry block, respectively.

8. The operational amplifier of claim 1, wherein the input stage is in a cascode configuration and comprising a further output terminal.

9. The operational amplifier of claim 8, further comprises a further output stage, said driving circuit further comprising a third portion analogous to said second portion which is interposed between said further output terminal and the further output stage.

10. The operational amplifier of claim 9, wherein the input stage comprises said second portion and said third portion.

11. The operational amplifier of claim 1, wherein the output stage comprising an output PMOS transistor and a output NMOS transistor connected in series with one another between the first reference potential and the second reference potential, the gate terminal of the output PMOS transistor and the gate terminal of the output NMOS terminal being the first and second input terminal of the output stage.

12. The operational amplifier of claim 1, wherein said load to be driven is of at least a resistive type or of resistive and capacitive type.

13. An Analog-to-Digital Converter comprising a two-stage class AB operational amplifier, the amplifier comprising:
    an input stage comprising differential input terminals and an output terminal operative to provide a driving signal;
    an output stage comprising first and second input terminals operatively connected to the input stage and operative to be driven on the basis of said driving signal;
    a driving circuit operatively interposed between the input stage and the output stage,
    wherein the driving circuit comprises
        a first portion comprising at least one resistor operatively connected between a first reference potential via a first circuitry block comprising a PMOS transistor and a second reference potential via a second circuitry block comprising a NMOS transistor, the voltage drop on said at least one resistor being fixed to a value depending on said first and second reference potentials and the gate-source voltages of said PMOS and NMOS transistors, respectively,
        a second portion comprising a first resistor and a second resistor having first terminals connected with one another in a common terminal which is connected to the output terminal of the input stage, said first resistor having a second terminal connected to the first input terminal of the output stage, said second resistor having a second terminal connected to the second input terminal of the output stage,
        said second terminals of the first and second resistors being connected to the first reference potential via a third circuitry block and to the second reference potential via a fourth circuitry block, respectively, said third and fourth circuitry blocks being arranged to be operatively connected to said first and second circuitry blocks, respectively, so that the voltage drop between the second terminals is substantially equal to the value of the voltage drop across said at least one resistor.

14. A digital audio device comprising:
a digital filter; and
an Analog-to-Digital Converter comprising a two-stage class AB operational amplifier,
the amplifier comprising
an input stage comprising differential input terminals and an output terminal operative to provide a driving signal;
an output stage comprising first and second input terminals operatively connected to the input stage and operative to be driven on the basis of said driving signal;
a driving circuit operatively interposed between the input stage and the output stage,
wherein the driving circuit comprises
a first portion comprising at least one resistor operatively connected between a first reference potential via a first circuitry block comprising a PMOS transistor and a second reference potential via a second circuitry block comprising a NMOS transistor, the voltage drop on said at least one resistor being fixed to a value depending on said first and second reference potentials and the gate-source voltages of said PMOS and NMOS transistors, respectively,
a second portion comprising a first resistor and a second resistor having first terminals connected with one another in a common terminal which is connected to the output terminal of the input stage, said first resistor having a second terminal connected to the first input terminal of the output stage, said second resistor having a second terminal connected to the second input terminal of the output stage,
said second terminals of the first and second resistors being connected to the first reference potential via a third circuitry block and to the second reference potential via a fourth circuitry block, respectively, said third and fourth circuitry blocks being arranged to be operatively connected to said first and second circuitry blocks, respectively, so that the voltage drop between the second terminals is substantially equal to the value of the voltage drop across said at least one resistor.

* * * * *